US010803941B2

(12) United States Patent
Mazed

(10) Patent No.: US 10,803,941 B2
(45) Date of Patent: Oct. 13, 2020

(54) SYSTEM ON CHIP (SOC) BASED ON NEURAL PROCESSOR OR MICROPROCESSOR

(71) Applicants: Mohammad A. Mazed, Yorba Linda, CA (US); Rex Wiig, Anaheim, CA (US); Angel Martinez, Anaheim, CA (US)

(72) Inventor: Mohammad A. Mazed, Chino Hills, CA (US)

( * ) Notice: Subject to any disclaimer, the term of this patent is extended or adjusted under 35 U.S.C. 154(b) by 0 days.

(21) Appl. No.: 15/530,191

(22) Filed: Dec. 12, 2016

(65) Prior Publication Data

US 2017/0140821 A1 May 18, 2017

Related U.S. Application Data

(63) Continuation-in-part of application No. 14/757,373, filed on Dec. 22, 2015, now Pat. No. 9,558,779.
(Continued)

(51) Int. Cl.
*G11C 13/04* (2006.01)
*G02B 6/12* (2006.01)
(Continued)

(52) U.S. Cl.
CPC ........ *G11C 13/047* (2013.01); *G02B 6/12004* (2013.01); *G11B 7/2433* (2013.01); *H01L 25/0657* (2013.01); *H01L 25/18* (2013.01); *H01L 27/2436* (2013.01); *H01L 27/2481* (2013.01); *H01L 45/1206* (2013.01); *H01L 45/1213* (2013.01); *B82Y 10/00* (2013.01);
(Continued)

(58) Field of Classification Search
CPC . G11C 13/047; G11C 13/004; G11C 13/0069; H01L 45/144; H01L 45/06; H01L 45/1213; H01L 45/1206; H01L 27/2436; H01L 27/2463; H01L 27/14621; H01L 25/18; H01L 25/0657; H01L 25/167; H01L 51/0541; H01L 51/0048; H01L 2225/06517; H01L 2225/06513; H01L 2225/06541; G02B 6/12004; G11B 7/2433
See application file for complete search history.

(56) References Cited

U.S. PATENT DOCUMENTS 5,353,247 A * 10/1994 Faris .................. G11B 7/00455
365/108
6,141,241 A * 10/2000 Ovshinsky .............. G11C 11/54
365/163
(Continued)

OTHER PUBLICATIONS

Ielmini et al., "Phase change materials in nob-volatile storage", 2011, Materials Today, vol. 14 No. 12 pp. 600-607 (Dec. 2011).*
(Continued)

*Primary Examiner* — Matthew L Reames

(57) ABSTRACT

System on chips (SoCs) based on a microprocessor or a neural processor (e.g., brain-inspired processor) electrically coupled with electronic memory devices and/or optically coupled with an optical memory device, along with embodiment(s) of a building block (an element) of the microprocessor/neural processor, the electronic memory device and the optical memory device are disclosed. It should be noted that a microprocessor can be replaced by a graphical processor.

11 Claims, 16 Drawing Sheets

Related U.S. Application Data

(60) Provisional application No. 62/124,613, filed on Dec. 22, 2014.

(51) Int. Cl.

| | | |
|---|---|---|
| *G11B 7/24* | (2013.01) | |
| *H01L 27/24* | (2006.01) | |
| *H01L 25/18* | (2006.01) | |
| *H01L 25/065* | (2006.01) | |
| *H01L 45/00* | (2006.01) | |
| *G11B 7/2433* | (2013.01) | |
| *H01L 25/16* | (2006.01) | |
| *H01L 51/05* | (2006.01) | |
| *H01L 51/00* | (2006.01) | |
| *B82Y 10/00* | (2011.01) | |

(52) U.S. Cl.
CPC ............ *H01L 25/167* (2013.01); *H01L 45/06* (2013.01); *H01L 45/1233* (2013.01); *H01L 45/144* (2013.01); *H01L 51/0048* (2013.01); *H01L 51/0541* (2013.01); *H01L 2224/16145* (2013.01); *H01L 2224/16225* (2013.01); *H01L 2225/06513* (2013.01); *H01L 2225/06517* (2013.01); *H01L 2225/06541* (2013.01); *H01L 2924/15311* (2013.01)

(56) References Cited

U.S. PATENT DOCUMENTS

| | | | | |
|---|---|---|---|---|
| 6,821,911 B1* | 11/2004 | Lo | ............................ | B82Y 10/00 438/253 |
| 8,548,334 B2* | 10/2013 | Mazed | ................. | H04B 10/272 398/140 |
| 9,093,304 B2* | 7/2015 | Koldiaev | ............... | H01L 21/845 |
| 9,336,879 B2* | 5/2016 | Lung | ................... | G11C 13/0064 |
| 2004/0057314 A1* | 3/2004 | Pavlichek | ............... | G11C 13/04 365/215 |
| 2008/0281220 A1* | 11/2008 | Sharifpour | ............ | A61B 5/0002 600/538 |
| 2008/0303014 A1* | 12/2008 | Goux | .................. | H01L 45/1246 257/3 |
| 2009/0273061 A1* | 11/2009 | Kishima | ................. | B82Y 20/00 257/632 |
| 2011/0158653 A1* | 6/2011 | Mazed | .................. | H04B 10/272 398/140 |
| 2012/0011093 A1* | 1/2012 | Aparin | .................. | G06N 3/0472 706/33 |
| 2013/0132506 A1* | 5/2013 | Morris | ............... | G06F 15/17331 709/216 |
| 2014/0103414 A1* | 4/2014 | Koldiaev | ............... | H01L 21/845 257/296 |
| 2015/0280118 A1* | 10/2015 | Lee | ........................ | H01L 45/141 438/382 |
| 2018/0267386 A1* | 9/2018 | Rios | ........................ | G02F 1/0126 |
| 2019/0130300 A1* | 5/2019 | Perone | ........................ | G06F 9/46 |

OTHER PUBLICATIONS

Lu et al., "Two-Terminal Resistive Switches (Memristors) for Memory and Logic Applications", 2011, Proceeding ASPDAC '11 Proceedings of the 16th Asia and South Pacific Design Automation Conference, pp. 217-223; Yokohama, Japan—Jan. 25-28, 2011).*

Woda, Michael, "Electrical transport in crystalline phase change material," Ph.D disertation, Nov. 2010.*

Burr et al, "Experimental demostration and Tolerancing of a Large-Scale Neural Network (165,000) Synapses using phase-change memory as the synaptic weight element," IEEE Nov. 11, 2015.*

Zalden et al. "Picosecond Electric-Field-Induced Threshold Switching in Phase-Change Materials," Physical Review Letters 117 Aug. 5, 2016. (Year: 2016).*

Malewar, "Researcher develop 'Darwin' Neural Processing Unit for AI systems," Techexporist https://www.techexplorist.com/darwin-neural-processing-unit/2122/ Jan. 22, 2016 (Year: 2016).*

Eles "Advanced Issues in Computer Architectures," System on Chip lecture May 21, 1999 (Year: 1999).*

Burr et al . "Neuropnnorphic computing using non-volatile memory," Advance in Physics :X vol. 2 publish online Dec. 4, 2016 (Year: 2016).*

Sun et al. "Single-chip microprocessor that communicates directly using light," Nature, 528 (7583) Dec. 23, 2015 (Year: 2015).*

Mepits "What is System on Chip?" Aug. 2015 (Year: 2015).*

Verma "What is Phase Change Memory? Why is it 1000 time faster than RAM?," http://www.ida.liu.se/~petel/architectures/lecture-notes/lect1.frm.ps, Aug. 16, 2016 (Year: 2016).*

Minz et al. "Thermal and Crosstalk-Aware Physical Design for 3D System on Package", IEEE Porc. Elec. Comp. and Tech. Conf. Jan. 2005 (Year: 2005).*

Tummala, Rao, "SOP: What Is It and Why? A New Microsystem-Integration Technology Paradigm-Moore's Law for System Integration of Miniaturized Convergent," IEEE Trans vol. 21 No. 2 p. 241 May 2004 (Year: 2004).*

Minz et al "Optical Routing for 3-D System-On-Package," IEEE TRANS. vol. 30 No. 4 p. 805 Dec. 2007 (Year: 2007).*

Abate, Tom " Stanford-led experiments point toward memory chips 1,000 times faster than today's," Stanford News Service https://news.standford.edu/press/view/9468 Aug. 2016 (Year: 2016).*

Servalli, G. "A 45nm Generatuin Phase Change Memory Technology," 2009 IEEE International Electron Devices Meeting, IEDM09-113, 2009 (Year: 2009).*

Wikipedia "AI accelerator," https://en.wikipedia.org/wiki/AI_accelerator . (Year: 2020).*

Painkras, et al. " SpiNaker: A 1-W 18 Core System on Chip for massively—Parallel Neural Network simulations," IEE Solid-state circuits vol. 48 No. 8 Aug. 2013 (Year: 2013).*

Burr et al., "Phase change memory technology," https://arxiv.org/abs/1001.1164 (Year: 2010).*

Rios et al., " Integrated all-photonic non-volatile multi-level memory," nature photonics 9,725-732 Sep. 2015 (Year: 2015).*

Gorchetchnikov, Review and Unification of Learning Framework in Cog Ex Machina Platform for Memristive Neuromorphic Hardware, IEEE Proceeding of Int. Joint Conf. on Neural Networks, Aug. 2011 (Year: 2011).*

Zalden et al. "Picosecond Electric-Field-Induced Threshold Switching in Phase-Change Materials", Physical Review Letter 117 Aug. 5, 2016 (Year: 2016).*

Painkras et al., "SpiNNaker: A 1-W 18 Core System-on-Chip for Massively-Parallel Neural Network Simulation", IEEE Journal of Solid-State Circuits, vol. 48, No. 8, Aug. 2013. (Year: 2013).*

Rios et al., "Integratable all-photonic non-volatile multi-level memory", Nature Photonics 9, 724-732 Sep. 2015. (Year: 2015).*

\* cited by examiner

SYSTEM ON CHIP (SOC) BASED ON NEURAL PROCESSOR OR MICROPROCESSOR

CROSS REFERENCE OF RELATED APPLICATION

The present application is a continuation-in-part (CIP) of U.S. Non-Provisional patent application Ser. No. 14/757,373 entitled SYSTEM ON CHIP (SoC) BASED ON PHASE TRANSITION AND/OR PHASE CHANGE MATERIAL", filed on Dec. 22, 2015 (which claims priority to U.S. Provisional Patent Application No. 62/124,613 entitled, "VANADIUM OXIDE ELECTRONIC MEMORY DEVICE", filed on Dec. 22, 2014).

The entire contents of all Non-Provisional Patent Applications and Provisional Patent Applications as listed in the previous paragraph are hereby incorporated by reference.

FIELD OF THE INVENTION

Technologies to replace today's microprocessor and memory device for greater speed, higher density, higher efficiency and neuron-like capabilities are critically needed in the computing marketplace. The present invention generally relates to various system on chips (SoCs) based on a microprocessor/graphical processor/neural processor, electrically coupled with electronic memory devices and/or optically coupled with an optical memory device, along with embodiment(s) of building block (an element) of the microprocessor/neural processor (e.g., brain-inspired processor), electronic memory device and optical memory device.

SUMMARY OF THE INVENTION

A first system on chip—a microprocessor electrically coupling with electronic memory devices and various embodiments of an electronic memory device are disclosed.

A second system on chip—a microprocessor optically coupling with an optical memory device is disclosed.

A third system on chip—a microprocessor optically coupling with an optical memory device and also electrically coupling with electronic memory devices is disclosed.

A fourth system on chip—a neural processor optically coupling with an optical memory device is disclosed.

A fifth system on chip—a neural processor optically coupling with an optical memory device and also electrically coupling with electronic memory devices is disclosed.

DETAIL DESCRIPTION OF THE DRAWINGS

Figure 1A:
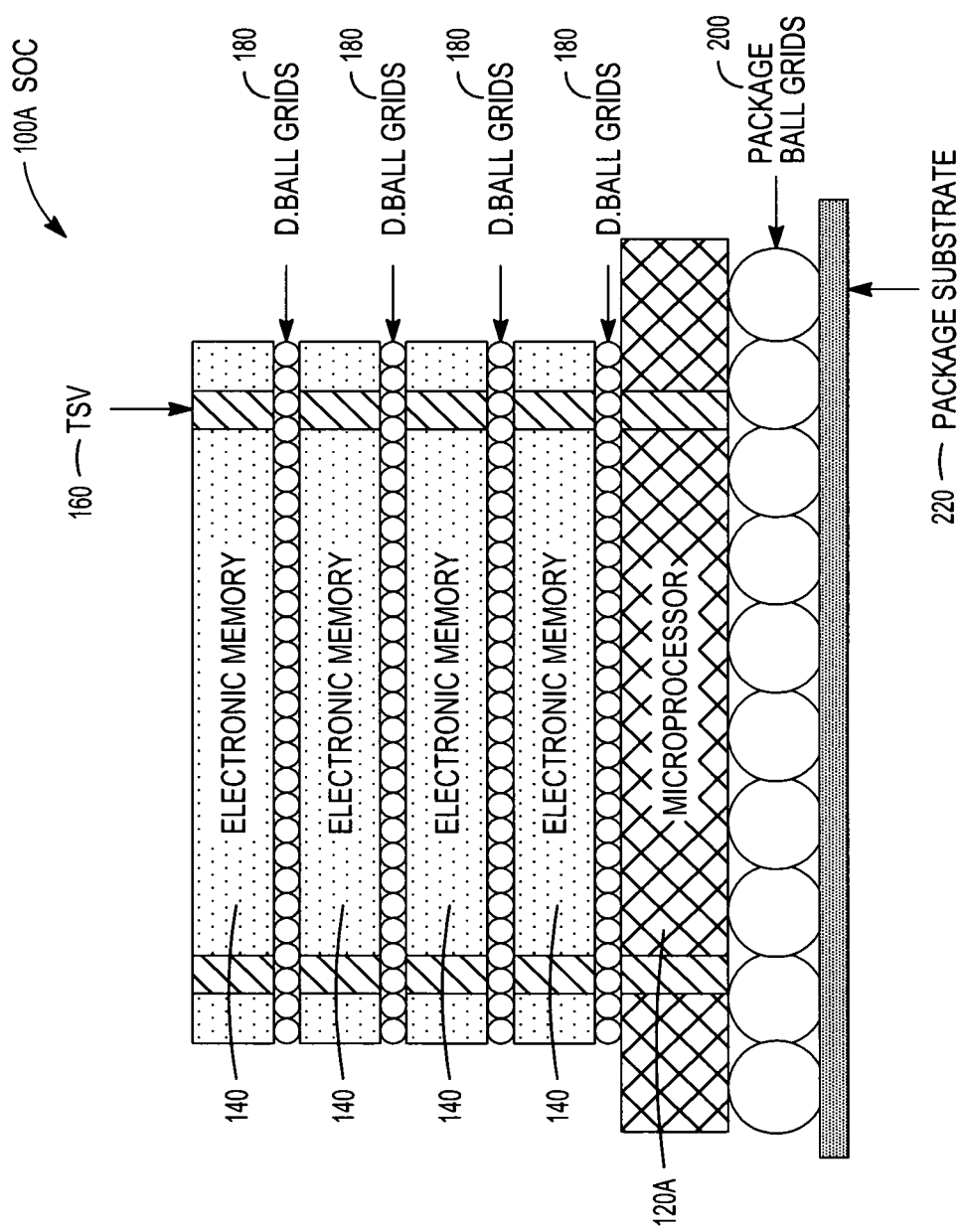
FIG. 1A illustrates an embodiment of a first system on chip, wherein a microprocessor is electrically coupling with electronic memory devices.

FIG. 1A illustrates an embodiment of 100A—a first system on chip. In FIG. 1A, 120A—a microprocessor is electrically coupled with 140s—the electronic memory devices through 160—a metalized through-semiconductor via hole (TSV). Device ball grids (for electrically coupling 140s—the electronic memory devices with 120A—the microprocessor) is denoted by 180. Package ball grids (for electrically coupling 120A—the microprocessor to 220—a package substrate) is denoted by 200.

Furthermore, 120A—the microprocessor can be replaced by a graphical processor. The building block (the element) of 140s—the electronic memory device are illustrated in FIGS. 5, 6, 7 and 8.

It should be noted that 140s—the electronic memory devices can integrate a combination of electronic memories as illustrated in FIGS. 5, 6, 7 and 8, depending on a particular performance need of 100A—the first system on chip.

Figure 1B:
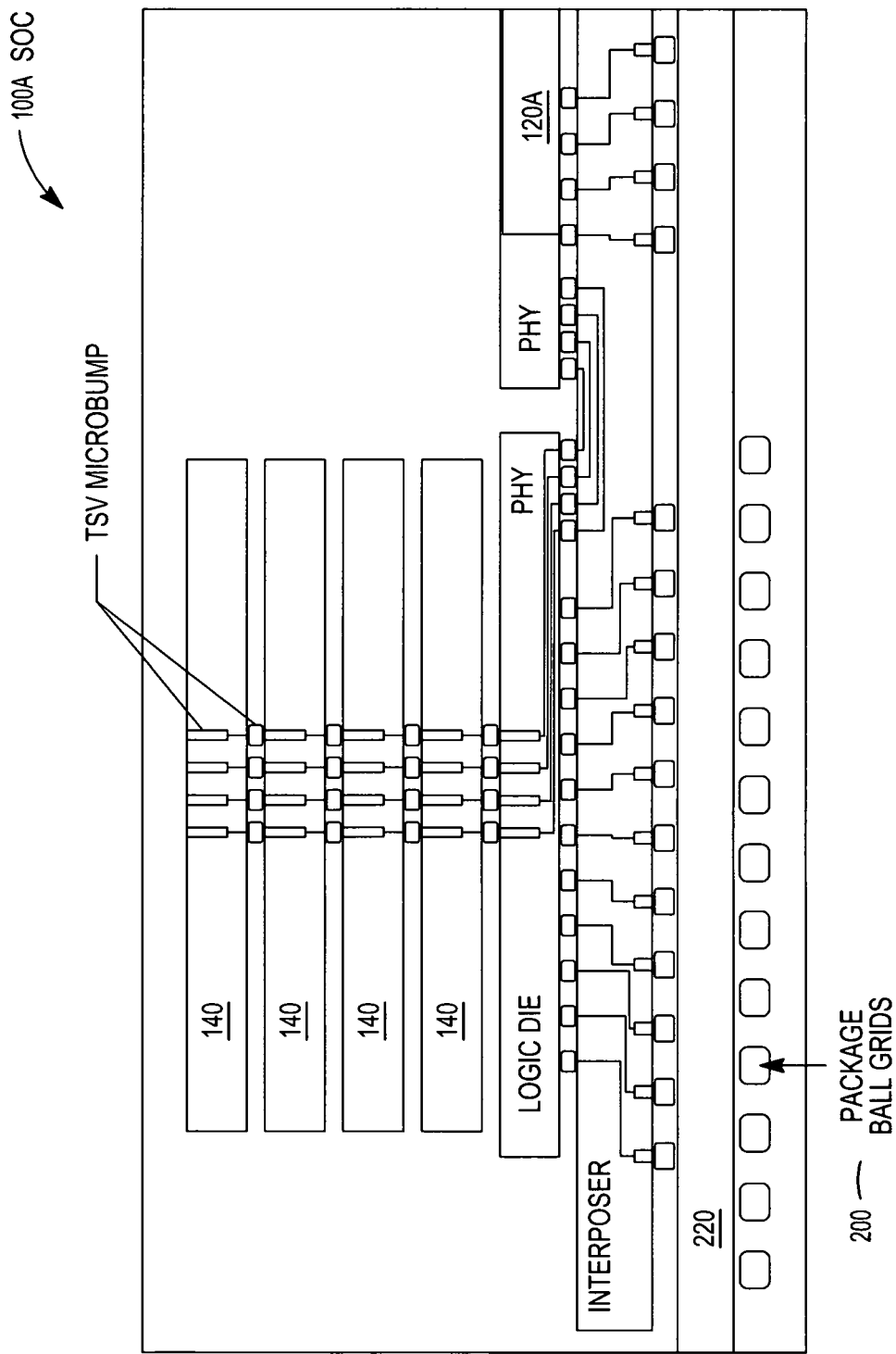
FIG. 1B illustrates another embodiment of the first system on chip, wherein the microprocessor is electrically coupling with electronic memory devices.

FIG. 1B illustrates another embodiment of 100A—the first system on chip, utilizing a common platform—an interposer for electrically coupling 140s—the electronic memory devices onto a logic die-communicating via a physical layer connection ("PHY") with 120A—the microprocessor on 220—the package substrate.

Figure 2:
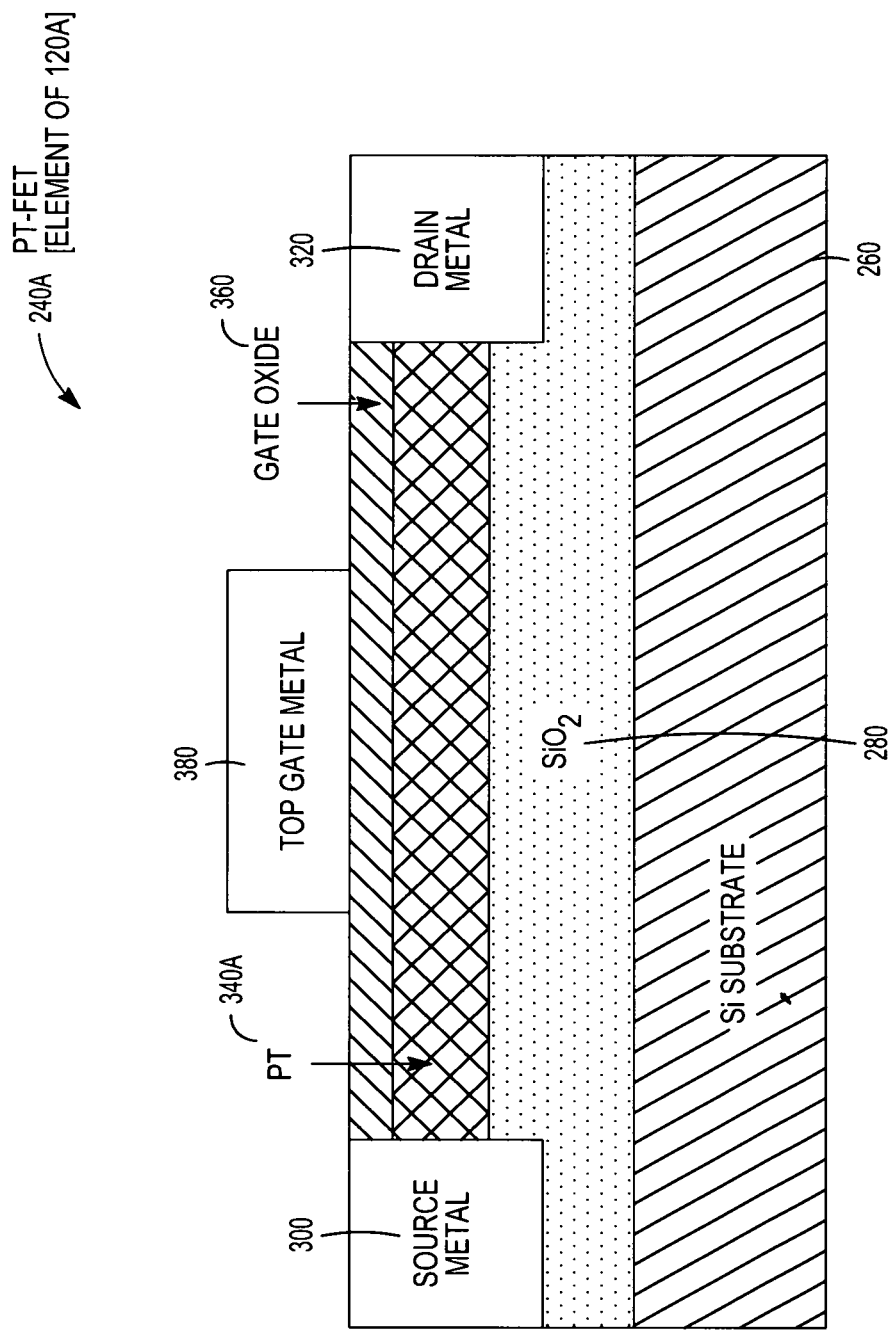
FIG. 2 illustrates an embodiment of a building block (an element: phase transition (PT) based field effect transistor (FET)) of the microprocessor.
Figure 3:
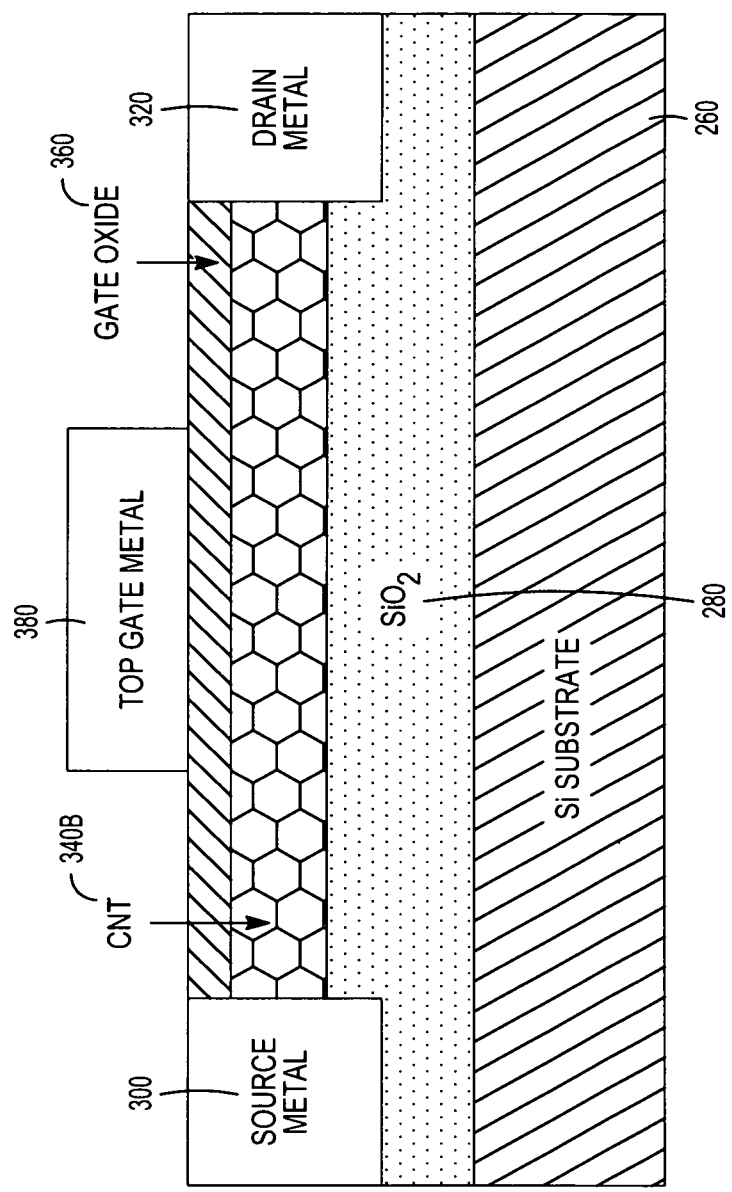
FIG. 3 illustrates another embodiment of a building block (an element: carbon nanotube based (CNT) field effect transistor) of the microprocessor.
Figure 4:
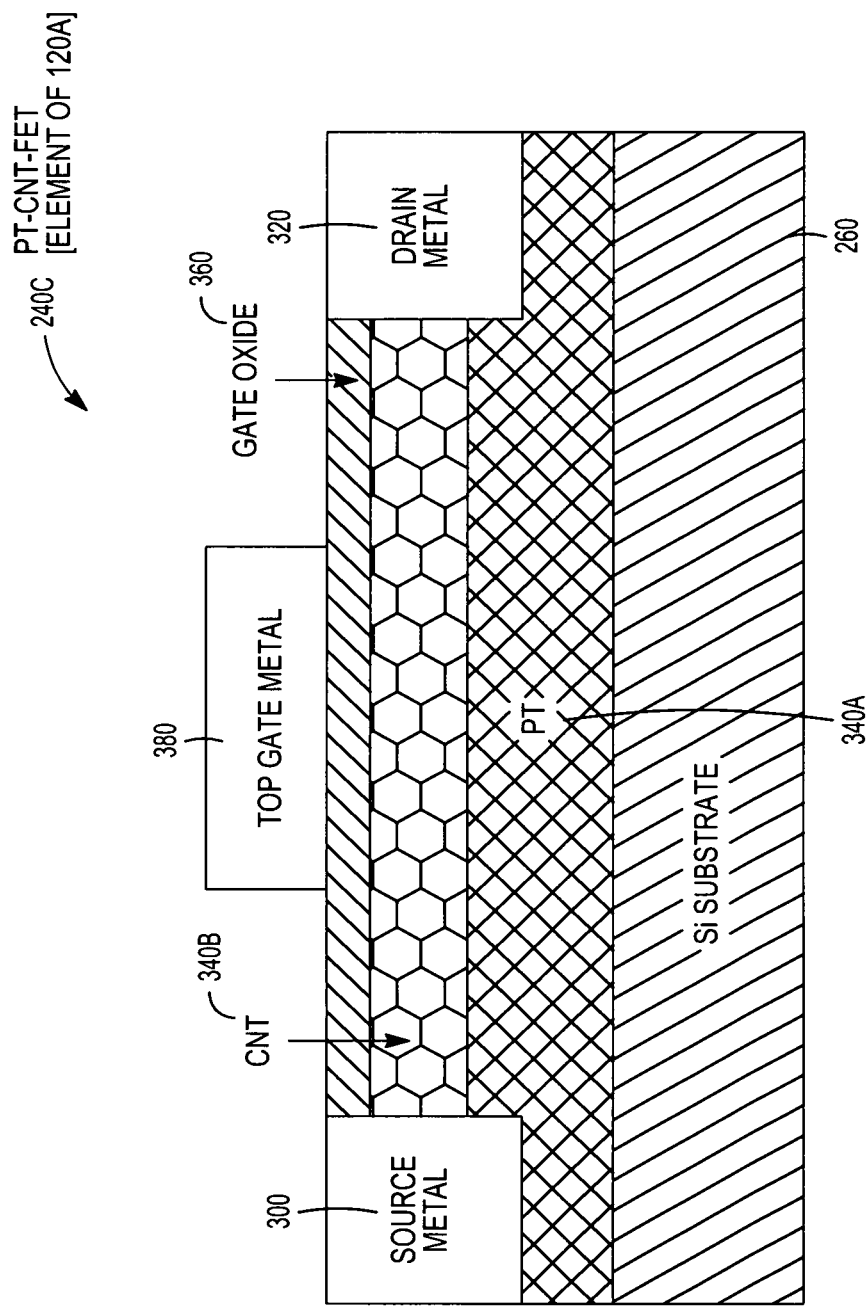
FIG. 4 illustrates another embodiment of a building block (an element: hybrid phase transition-carbon nanotube (PT-CNT) based field effect transistor) of the microprocessor.

FIGS. 2-4 illustrate various embodiments of a building block (an element) of 120A—the microprocessor. The building block of 120A—the microprocessor can be a field effect transistor.

FIG. 2 illustrates 240A—a phase transition material based field effect transistor. In FIG. 2, a silicon substrate is denoted by 260, a silicon dioxide dielectric is denoted by 280, a source metal is denoted by 300, a drain metal is denoted by 320, a phase transition material is denoted by 340A, a gate oxide (e.g., hafnium oxide) is denoted by 360 and a top gate metal is denoted by 380.

FIG. 3 illustrates 240B, carbon nanotube based field effect transistor. In FIG. 3, the silicon substrate is denoted by 260, the silicon dioxide dielectric is denoted by 280, the source metal is denoted by 300, the drain metal is denoted by 320, a carbon nanotube is denoted by 340B, the gate oxide is denoted by 360 and the top gate metal is denoted by 380. 340B—the carbon nanotube can be metallurgically coupled/connected/welded to the source metal 300 and the drain metal 320, utilizing a metal layer.

FIG. 4 illustrates 240C, a hybrid phase transition material-carbon nanotube based field effect transistor. In FIG. 4, the silicon substrate is denoted by 260, the silicon dioxide dielectric is denoted by 280, the source metal is denoted by 300, the drain metal is denoted by 320, a phase transition material is denoted by 340A, the carbon nanotube is denoted by 340B, the gate oxide is denoted by 360 and the top gate metal is denoted by 380. 340B—the carbon nanotube can be metallurgically coupled/connected/welded to the source metal 300 and the drain metal 320, utilizing a metal layer.

Many types of electronic memory devices (e.g., a dynamic random access memory (DRAM)/NAND flash) are used in present computing systems. Dynamic random access memory is an electronic volatile memory device that stores each bit of data in a separate capacitor. The capacitor can be either charged or discharged. These two states can represent the two values of a bit, conventionally called 0 and 1. The capacitor will slowly discharge and the data eventually fades, unless the capacitor charge is refreshed periodically. NAND flash memory device is an electronic non-volatile memory device that can be electrically erased and reprogrammed. Present invention of an electronic memory device based on a phase change material which can replace dynamic random access electronic memory device.

Figure 5:
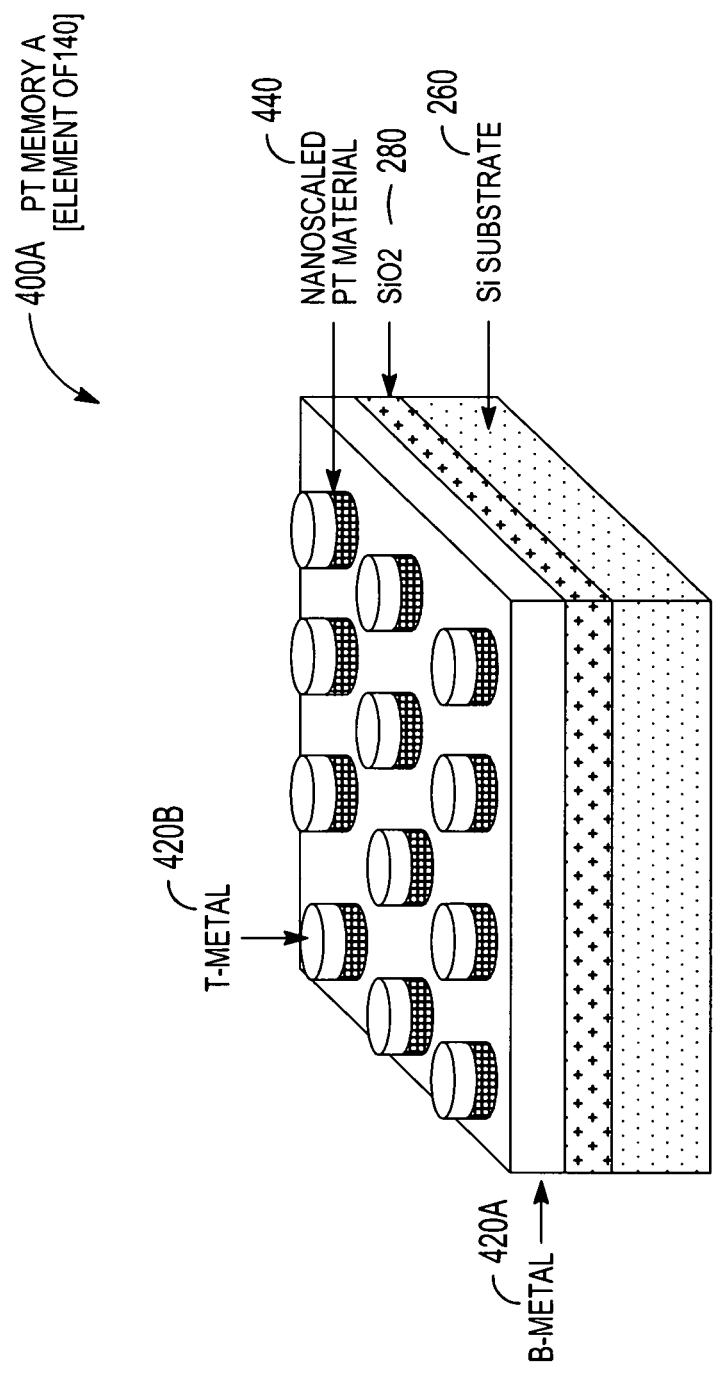
FIG. 5 illustrates an embodiment of a building block (an element: based on a nanoscaled (wherein, the nanoscaled is defined as less than 1000 nanometers in any dimension) phase transition material in this utility patent application) of an electronic memory device.

FIG. 5 illustrates an embodiment of a cross-sectional design of a cell of 400A—an electronic memory device based on a nanoscaled phase transition material. In FIG. 5, the silicon substrate is denoted by 260, the silicon dioxide dielectric is denoted by 280, a bottom metal is denoted by 420A, a nanoscaled phase transition material is denoted by 440 and a top metal is denoted by 420B.

Figure 6:
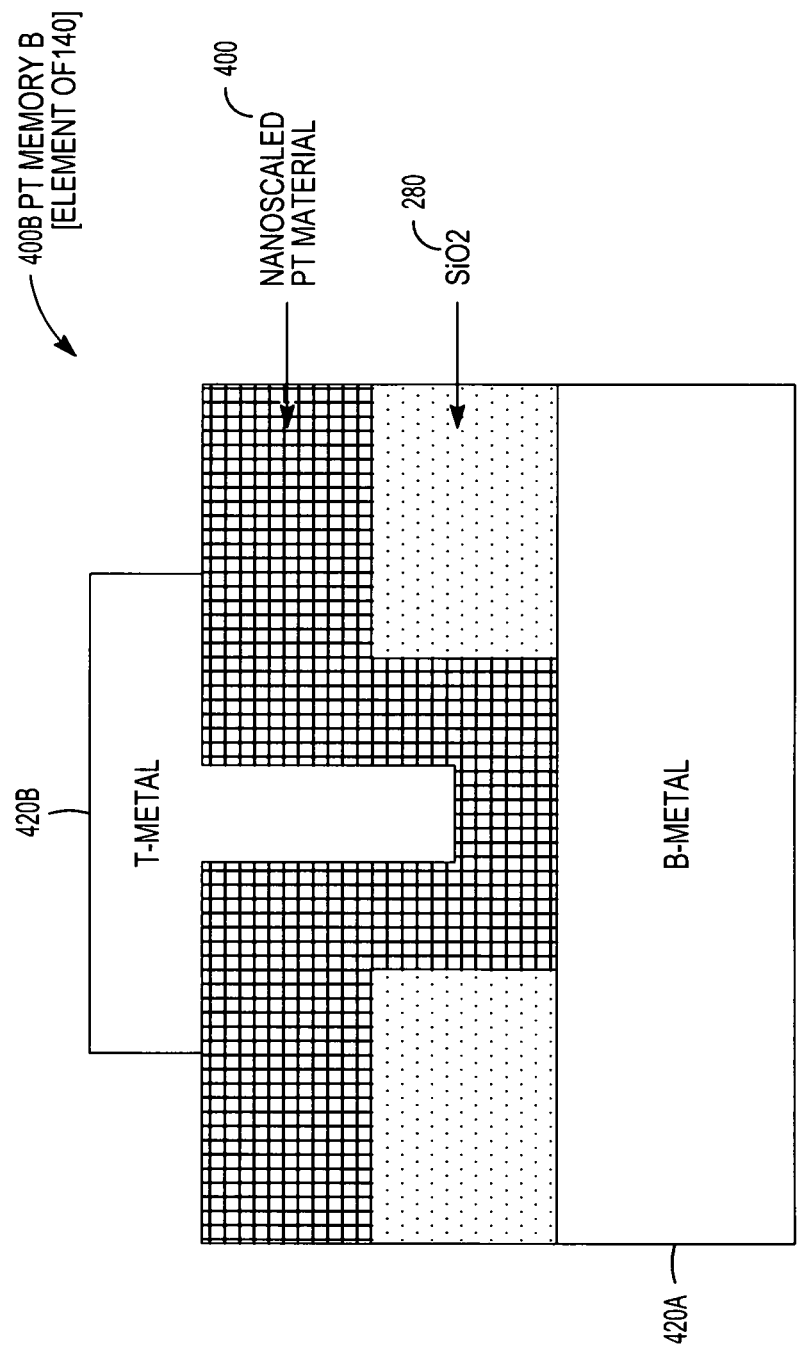
FIG. 6 illustrates another embodiment of a building block (an element: based on a nanoscaled phase transition material) of the electronic memory device.

FIG. 6 illustrates another embodiment of a cross-sectional design of a cell of 440B—the electronic memory device based on a nanoscaled phase transition material. In FIG. 6, the bottom metal is denoted by 420A, the silicon dioxide is denoted by 280, the nanoscaled phase transition material is denoted by 440 and the top metal is denoted by 420B.

Figure 7:
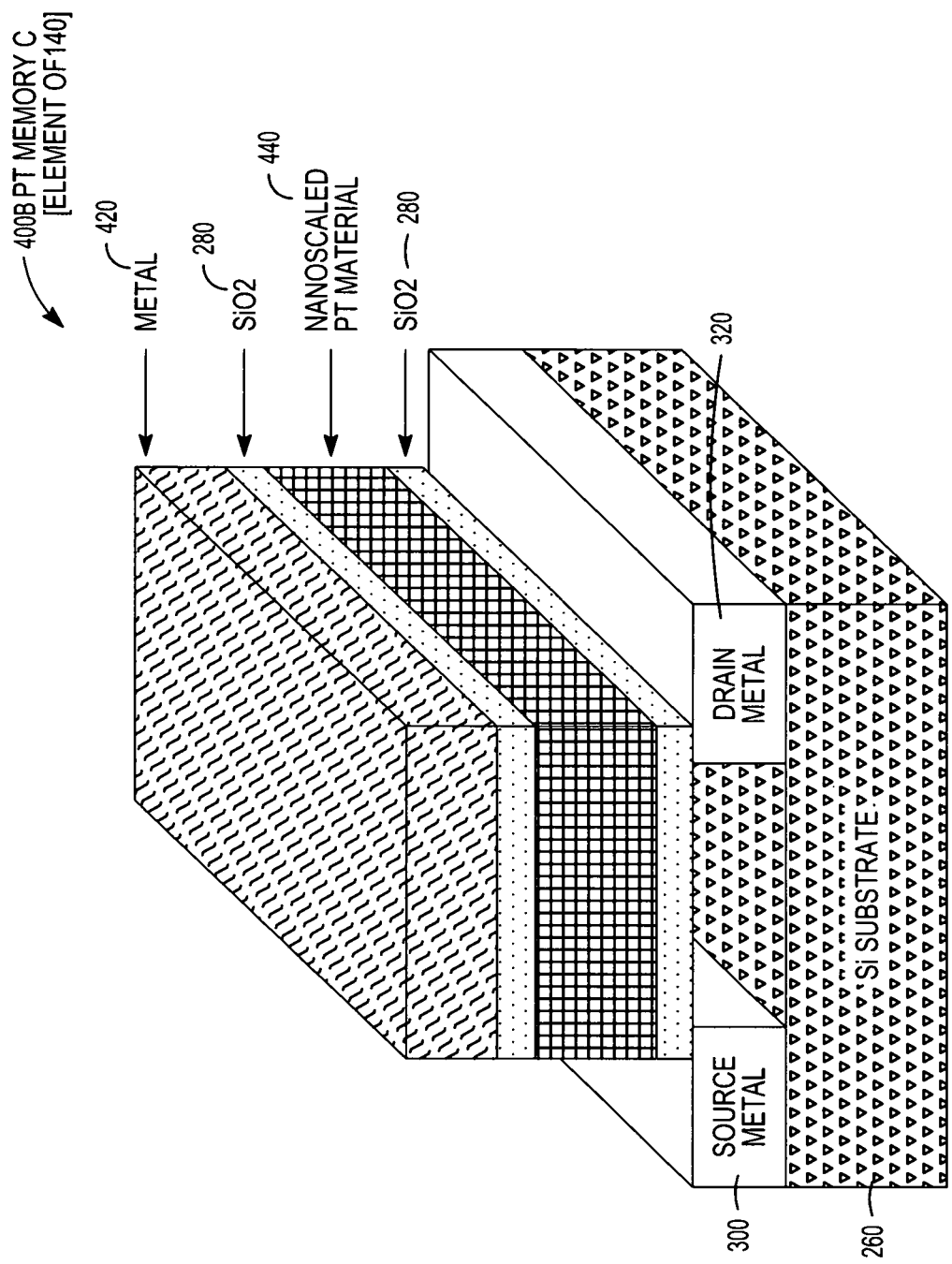
FIG. 7 illustrates another embodiment of a building block (an element: based on a nanoscaled phase transition material) of the electronic memory device.

FIG. 7 illustrates another embodiment of a cross-sectional design of a cell of 400C—the electronic memory device based on nanoscaled phase transition material. In FIG. 7, the silicon substrate is denoted by 260, the source metal is denoted by 300, the drain metal is denoted by 320, the silicon dioxide is denoted by 280, the nanoscaled phase transition material is denoted by 440, another silicon dioxide (e.g., fabricated/constructed by atomic layer deposition (ALD)) is denoted by 280 and the metal is denoted by 420.

Furthermore, $Hf_{0.5}Zr_{0.5}O_2$ ferroelectric ultra thin-film (of about 15 nanometers to 30 nanometers in thickness) can replace both the nanoscaled phase transition material 440 and another silicon dioxide 280.

Figure 8:
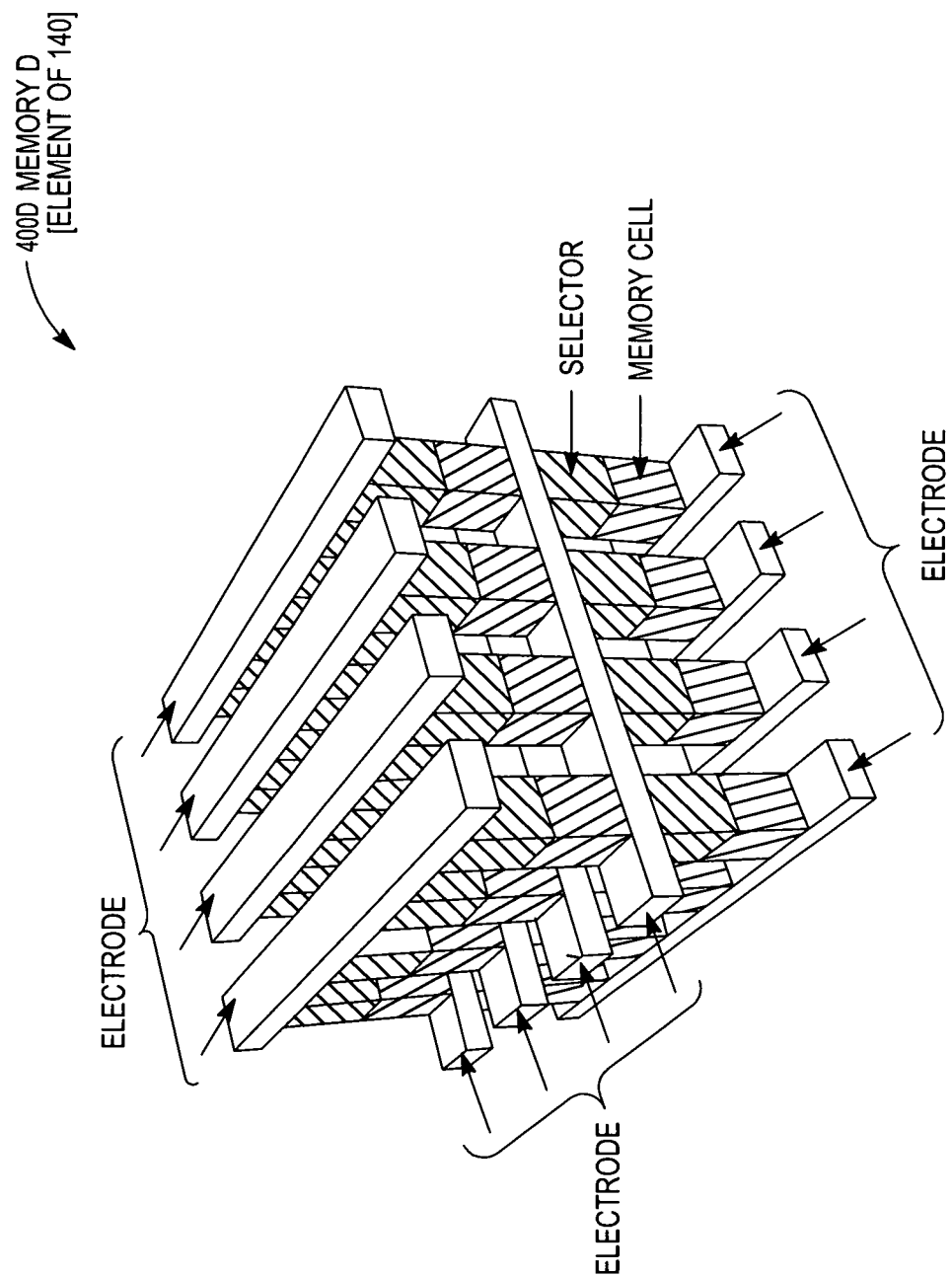
FIG. 8 illustrates another embodiment of a building block (an element: based on a nanoscaled phase change/nanoscaled phase transition material) of the electronic memory device.

FIG. 8 illustrates another embodiment (stacked in a three-dimensional configuration) of a cross-sectional design of a cell of 400D—an electronic memory device based on a nanoscaled phase change (e.g., nanoscaled $Ag_4In_3Sb_{67}Te_{26}$ (AIST))/nanoscaled phase transition (e.g., nanoscaled vanadium dioxide) material. Here a cell of 400D—the electronic memory device can be individually selected by a selector device. About 15 nanometers to 30 nanometers thick $Ag_4In_3Sb_{67}Te_{26}$ based phase change material in the cell of 400D—the electronic memory device can replace dynamic random access memory electronic memory device. $Ag_4In_3Sb_{67}Te_{26}$ ultra thin-film (of about 15 nanometers to 30 nanometers thickness) can be excited by terahertz electrical pulses of few picoseconds in time duration and suitable (e.g., about 200 kV/cm) threshold electric field strength.

Furthermore, $Ag_4In_3Sb_{67}Te_{26}$ (AIST) ultra thin-film (of about 15 nanometers to 30 nanometers thickness) can be also utilized as the selector device.

Figure 9:
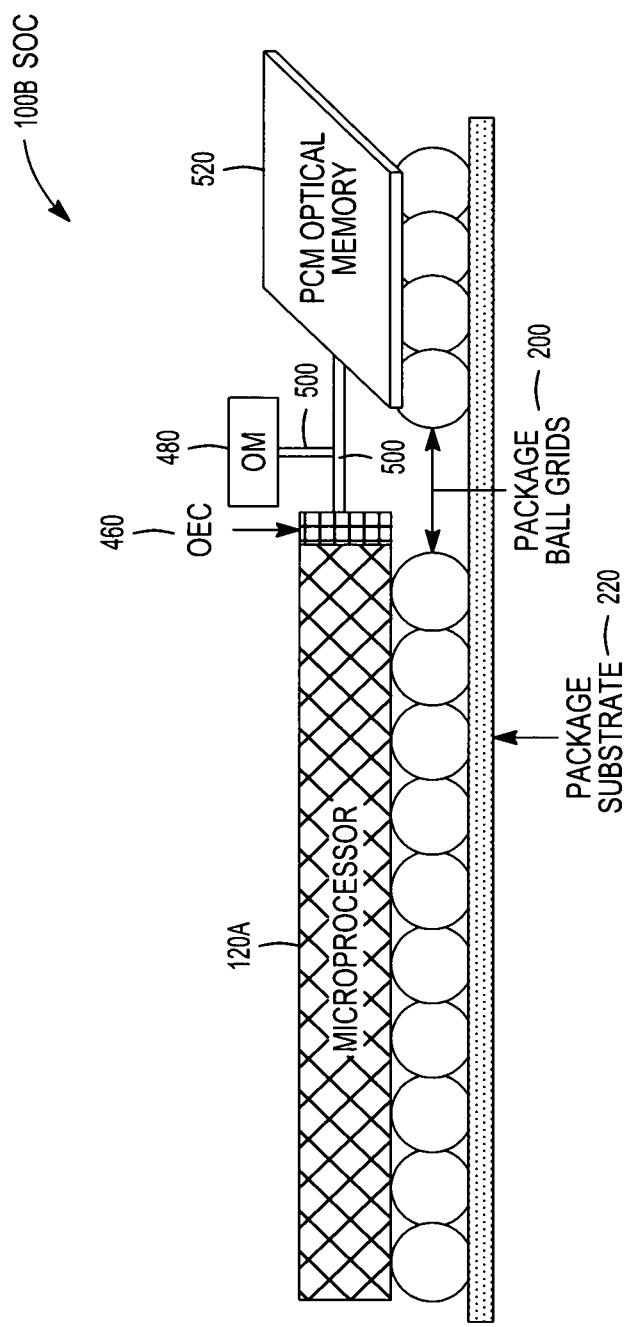
FIG. 9 illustrates an embodiment of a second system on chip, wherein a microprocessor is optically coupling with an optical memory device.

FIG. 9 illustrates an embodiment of 100B—a second system on chip. In FIG. 9, 120A—the microprocessor is optically coupled with 520—an optical memory device. In FIG. 9, the microprocessor is denoted by 120A, which is electrically coupled to the package substrate 220 with the package ball grids 200. 120A—the microprocessor is electro-optically coupled by 460, an optical to electrical converter (OEC) device.

It should be noted that 140s—the electronic memory devices can integrate a combination of electronic memories as illustrated in FIGS. 5, 6, 7 and 8, depending on a particular performance need of 100B—the second system on chip.

An optical module (OM)/device is denoted by 480, which provides many wavelengths of controlled intensities. 480—the optical module/device includes a light source of one or more wavelengths, or light sources of one or more wavelengths.

Figure 15:
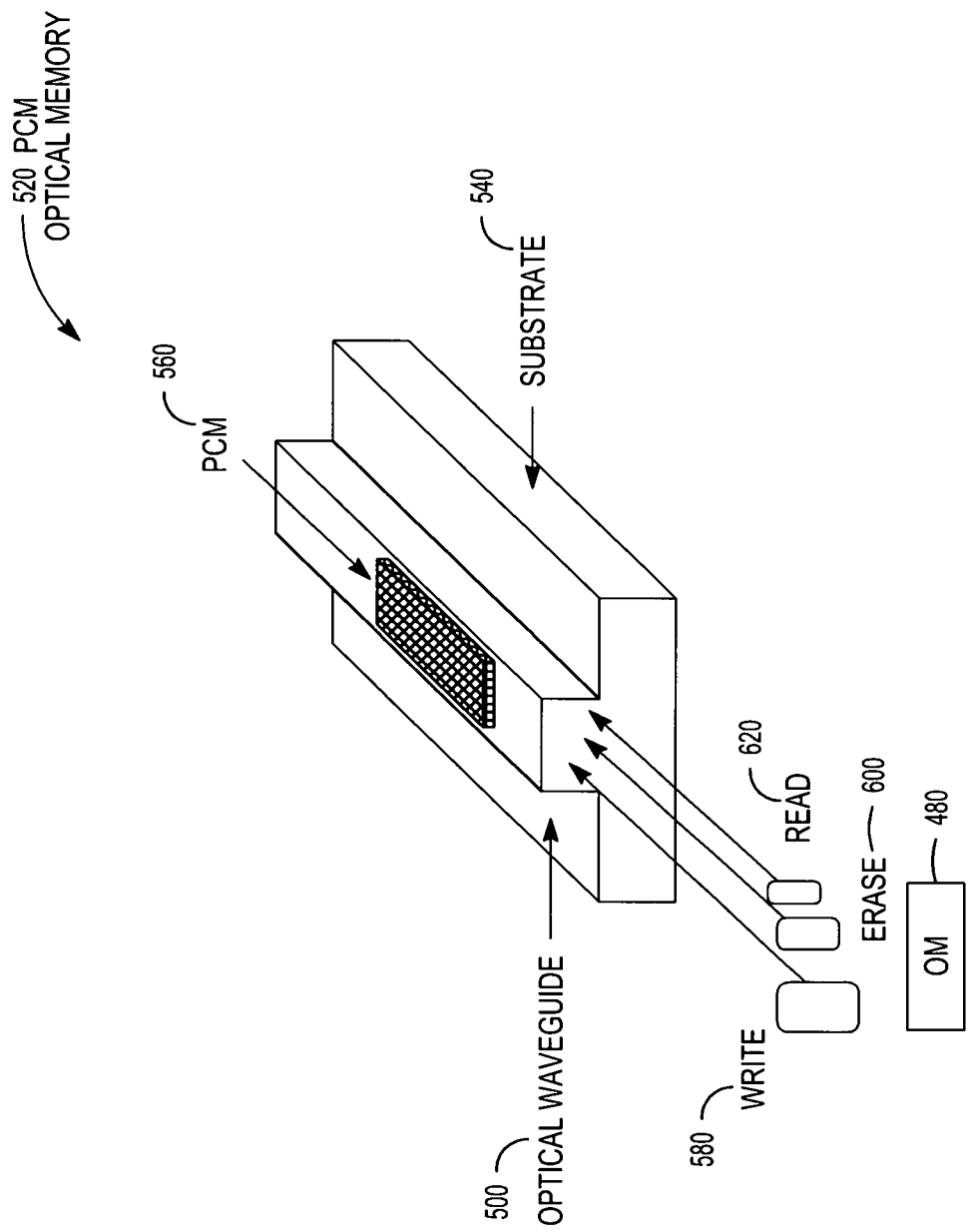
FIG. 15 illustrates an embodiment of a building block (an element: based on a phase change material) of the optical memory device. It should be noted that a phase change material can be also replaced by a phase transition material. Additionally, the phase change material/phase transition material can be nanoscaled.

460—the optical to electrical converter device, 480—the optical module/device and 520—the optical memory device are optically coupled by 500—an optical waveguide. In FIG. 9, 120A—microprocessor can be optically coupled with 520—the optical memory device by 460—the optical to electrical converter device or 480—the optical module/device or 500—the optical waveguide, or alternatively a combination of 460—the optical to electronic converter device, 480—the optical module/device and 500—the optical waveguide. Details of 520—the optical memory device are illustrated in FIG. 15.

Figure 10:
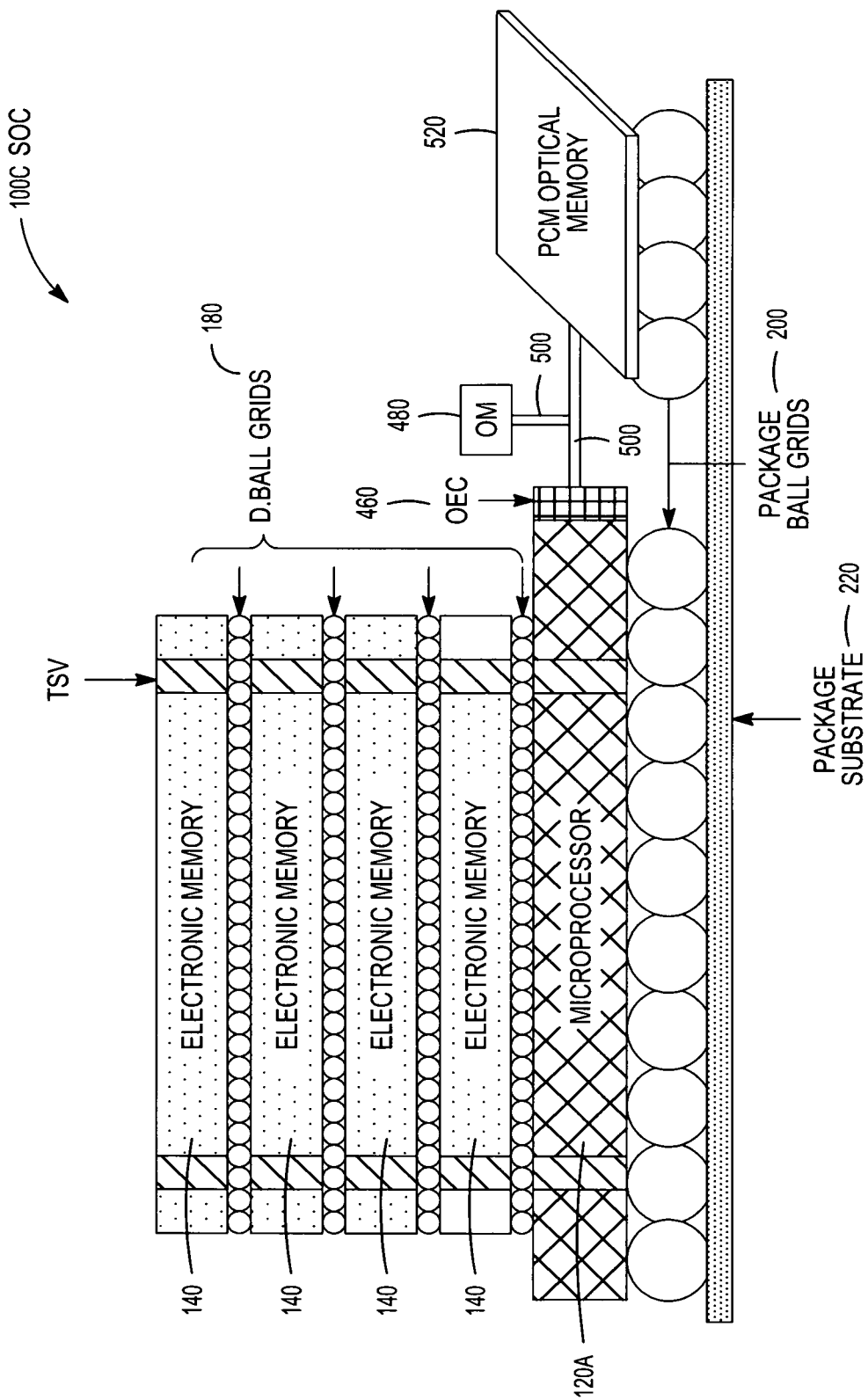
FIG. 10 illustrates an embodiment of a third system on chip, wherein a microprocessor is optically coupling with the optical memory device and also electrically coupling with the electronic memory devices.

FIG. 10 illustrates an embodiment of 100C, a third system on chip. In FIG. 10, 120A—the microprocessor is optically coupled with 520—the phase change material (PCM) based optical memory device. FIG. 10 is similar to FIG. 9 with exception that 120A—the microprocessor is additionally electrically coupled with 140s—the electronic memory devices. 120A—the microprocessor is electrically coupled with 140s—the electronic memory devices through 160, the metalized through-semiconductor via hole. Device ball grids (for electrically connecting 140—the electronic memory devices with 120—the microprocessor) is denoted by 180. The package ball grids (for electrically coupling 120-the microprocessor to 220—the package substrate) is denoted by 200. In FIG. 10, 120A—microprocessor can be optically coupled with 520—the optical memory device by 460—the optical to electrical converter device or 480—the optical module/device or 500—the optical waveguide, or alternatively a combination of 460—the optical to electrical converter device, 480—the optical module/device and 500—the optical waveguide.

It should be noted that 140s—the electronic memory devices can integrate a combination of electronic memories as illustrated in FIGS. 5, 6, 7 and 8, depending on a particular performance need of 100C—the third system on chip.

Figure 11:
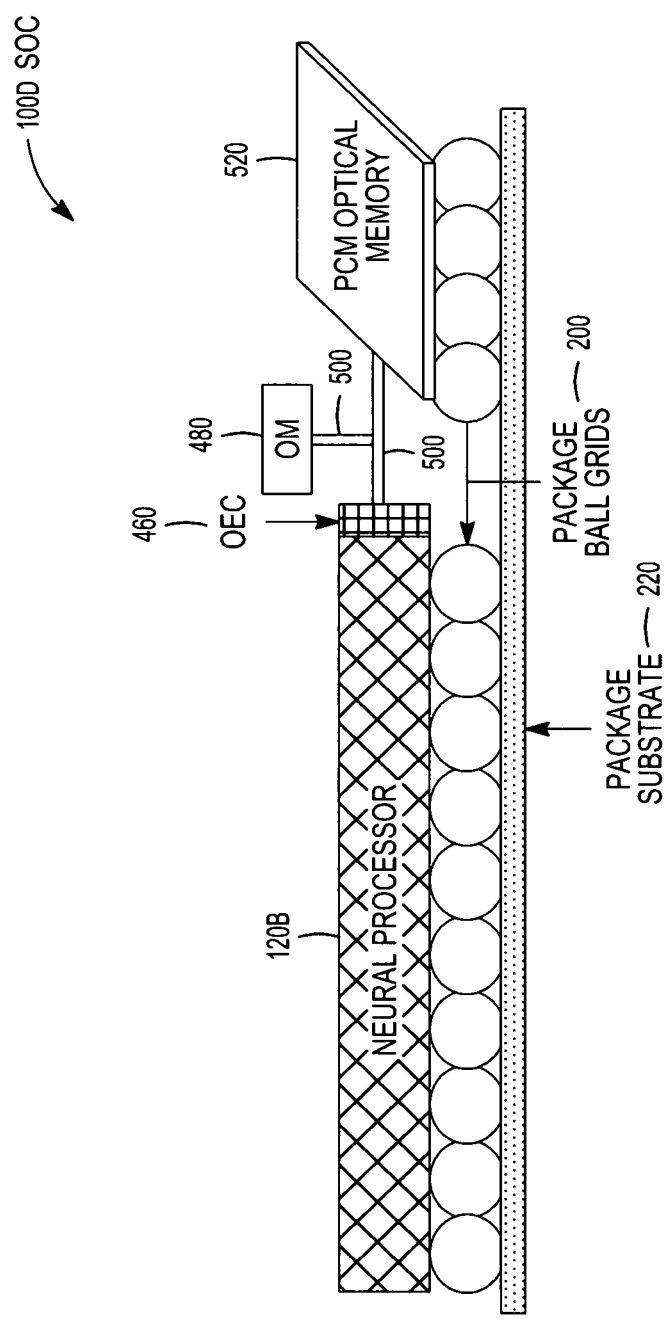
FIG. 11 illustrates an embodiment of a fourth system on chip, wherein a neural processor is optically coupling with the optical memory device.

FIG. 11 illustrates an embodiment of 100D—a fourth system on chip. In FIG. 11, a neural processor is denoted by 120B, which is electrically coupled to the package substrate 220 with the package ball grids 200. 120B—the neural processor is electro-optically coupled by 460 the optical to electrical converter device. The optical module/device is denoted by 480, which provides many wavelengths of controlled intensities. 460—the optical to electrical converter, 480—the optical module/device and 520—the optical memory device are optically coupled by 500—the optical waveguide. In FIG. 11, 120B—neural processor can be optically coupled with 520—the optical memory device by 460—the optical to electrical converter device or 480—the optical module/device or 500—the optical waveguide, or alternatively a combination of 460—the optical to electrical converter device, 480—the optical module/device and 500—the optical waveguide.

It should be noted that 140s—the electronic memory devices can integrate a combination of electronic memories as illustrated in FIGS. 5, 6, 7 and 8, depending on a particular performance need of 100D—the fourth system on chip.

Figure 12:
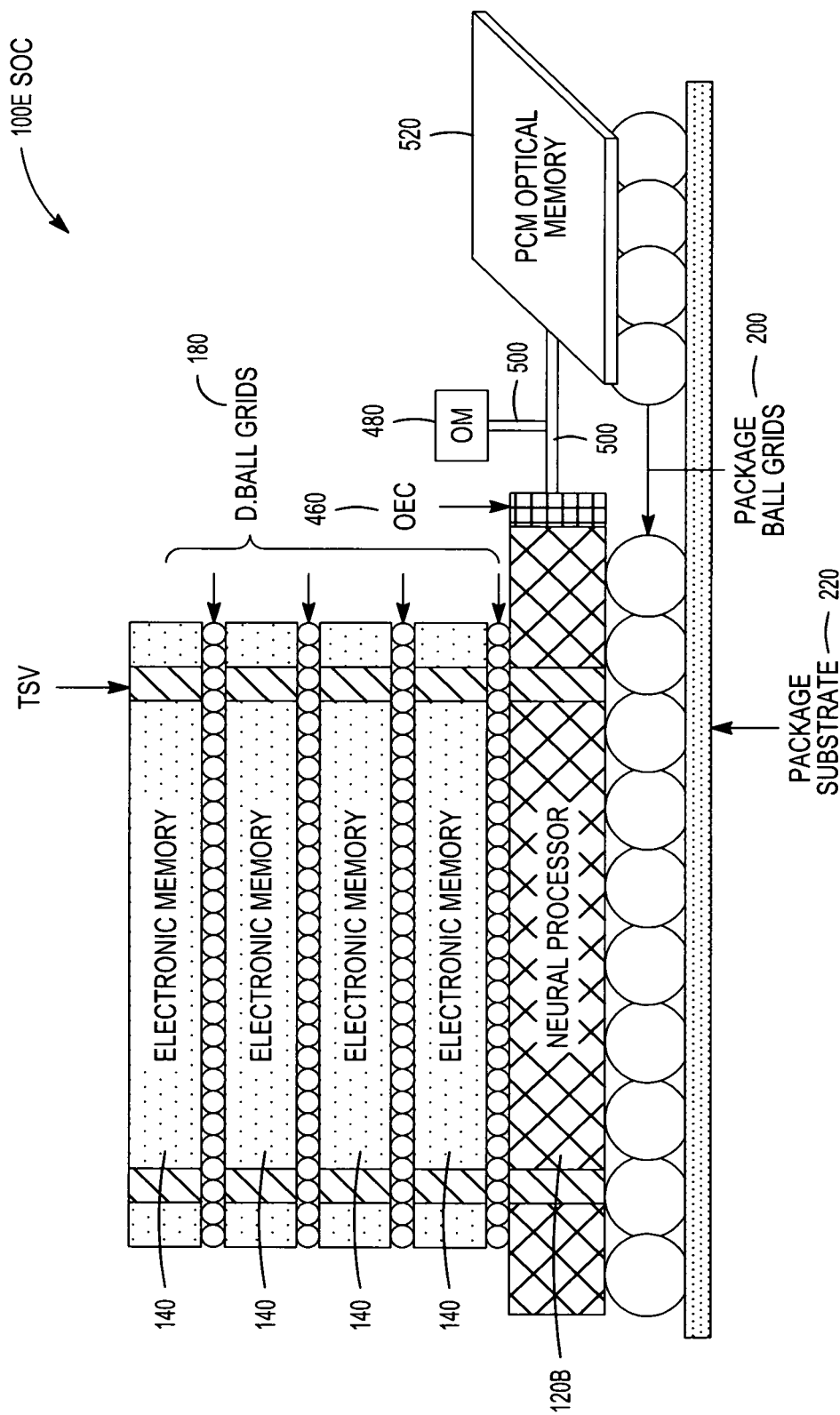
FIG. 12 illustrates an embodiment of a fifth system on chip, wherein the neural processor is optically coupling with the optical memory device and also electrically coupling with the electronic memory devices.

FIG. 12 illustrates an embodiment of 100E—a fifth system on chip. FIG. 12 is similar to FIG. 11 with exception that 120B—the neural processor is additionally electrically coupled with 140s—the electronic memory devices. In FIG. 12, 120B—the neural processor can be optically coupled with 520—the optical memory device by 460—the optical to electrical converter device or 480—the optical module/device or 500—the optical waveguide, or alternatively a combination of 460—the optical to electronic converter device, 480—the optical module/device and 500—the optical waveguide.

It should be noted that 140s—the electronic memory devices can integrate a combination of electronic memories as illustrated in FIGS. 5, 6, 7 and 8, depending on a particular performance need of 100E—the fifth system on chip.

Figure 13:
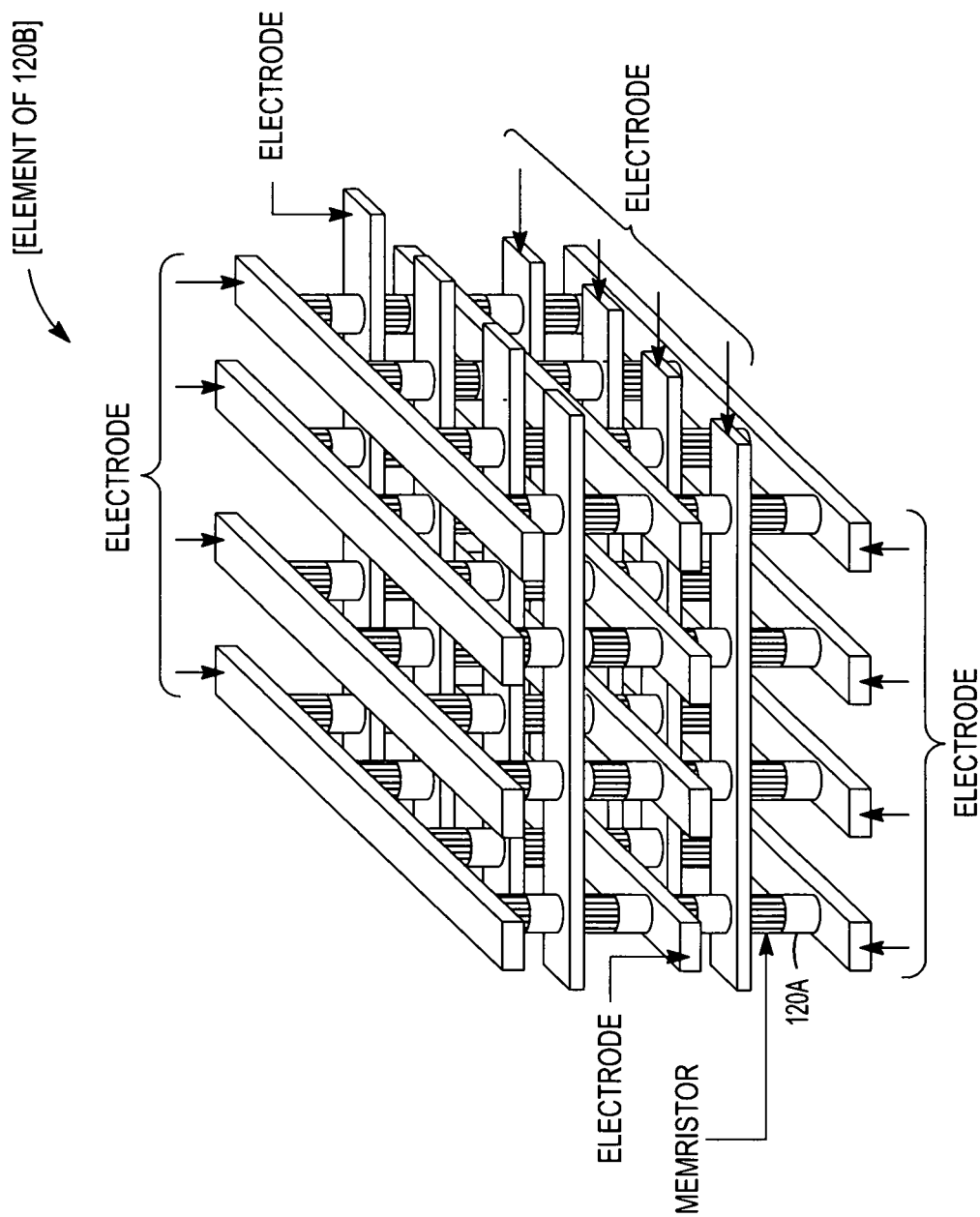
FIG. 13 illustrates an embodiment of a building block (an element: based on memristors and microprocessors) of the neural processor. It should be noted that a microprocessor can be replaced by a graphical processor.

FIG. 13 illustrates an embodiment of a building block (an element) of 120B—the neural processor, which comprises microprocessors and memristors (e.g., a phase change/phase transition/ferroelectric/transition metal oxide (TMO)/silicon-rich oxide based material for the memristor) stacked in the three-dimensional (3-D) arrangement. Memristors can (a) save CPU processing bottleneck, (b) improve memory management, and (c) enable efficient in data processing due to interactions of memristors and transistors (of 120A—the microprocessor). In the transistor (of 120A—the microprocessor) once the flow of electrons is interrupted by, say, cutting the power, all information is lost. But a memristor can remember the amount of charge that was flowing through it and it has another fundamental difference compared with transistors—it can escape the rigid boundaries of microprocessor's digital binary codes. A memristor can also have multi-levels e.g., zero, one half, one quarter, one third and so on and that creates a very powerful memristive based smart neuromorphic computer, where it itself can adapt and learn/relearn. Alternatively, the building block (the element) of 120B—the neural processor can include memristors and just one 120A—the microprocessor. It should be noted that, any material of the memristor can be nanoscaled and 120A—the microprocessor can be replaced by a graphical processor.

Figure 14:
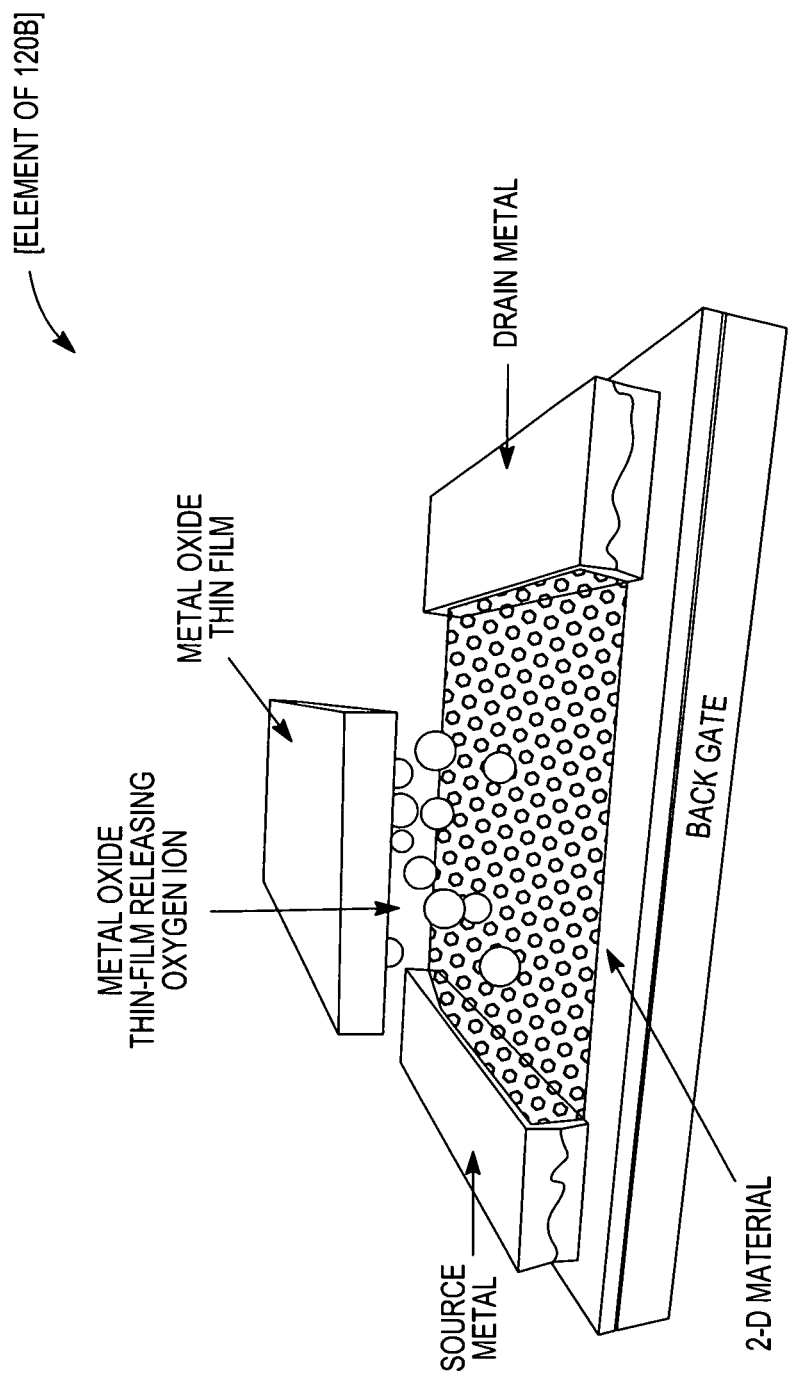
FIG. 14 illustrates another embodiment of a building block (an element: based on a metal oxide layer releasing oxygen ions) of the neural processor.

FIG. 14 illustrates another embodiment of a building block (an element) of 120B—the neural processor, which comprises a metal oxide layer releasing oxygen ions and field effect transistor, utilizing a two-dimensional material (e.g., graphene/indium selenide (InSe)), a source metal and a drain metal.

FIG. 15 illustrates an embodiment of 520—the optical memory device. In FIG. 15, 500—the optical waveguide is fabricated on 540—a substrate (e.g., silicon on insulator (SOI) substrate). 500—the optical waveguide has 560-a patch of a phase change material. 560—the patch of a phase change material is activated for writing, reading and erasing by various wavelengths of controlled optical intensities from 480—the optical module/device. Write wavelength (a first wavelength) of a controlled first optical intensity is denoted by 580, erase wavelength (a second wavelength) of a controlled second optical intensity is denoted by 600 and read wavelength (a third wavelength) of a controlled third optical intensity is denoted by 620.

Furthermore, 560—the patch of the phase change material (e.g., germanium-antimony-tellurium (GST) or $Ag_4In_3Sb_{67}Te_{26}$) can be replaced by a phase transition material (e.g., vanadium dioxide). Additionally, it should be noted that the phase change material or the phase transition material can be nanoscaled.

In the above disclosed specifications "/" has been used to indicate an "or". Any example in the preferred best mode embodiments is by way of an example only and not by way of any limitation.

The above disclosed specifications are the preferred best mode embodiments of the present invention. The specifications are not intended to be limiting only to the preferred best mode embodiments of the present invention. Numerous variations and/or modifications (e.g., electrically/optically coupled can be replaced by electrically/optically connected or an optical module can be replaced by an optical device) are possible within the scope of the present invention. Accordingly, the disclosed preferred best mode embodiments are to be construed as illustrative only. The inventors of the present invention are not required to describe each and every conceivable and possible future embodiment(s) in the preferred best mode embodiments of the present invention. A claim of this invention covers not only the literal elements in the claim, but also the equivalents of those elements. Thus, the scope and spirit of this invention shall be defined by the claims and the equivalents of the claims only. The exclusive use of all variations and/or modifications within the scope of the claims is reserved. Unless a claim term is specifically defined in the preferred best mode embodiments, then a claim term has an ordinary meaning, as understood by a person with an ordinary skill in the art, at the time of the present invention. Furthermore, the term—"means" was not used nor intended nor implied in the disclosed preferred best mode embodiments of the present invention. Thus, the inventor has not limited the scope of the claims as mean plus function. Furthermore, the scope and spirit of the present invention shall be defined by the claims and the equivalents of the claims only.

We claim:

1. A system comprising: a neural processor,
wherein the neural processor comprises memristors,
wherein the neural processor is coupled with an optical memory device by an optical signal to electronic signal converter (OEC) device,
wherein the optical signal to electronic signal converter (OEC) device is coupled with an optical device,
wherein the optical device provides
  (i) a first wavelength for writing,
  (ii) a second wavelength for erasing,
  (iii) a third wavelength for reading,
wherein the optical memory device is activated by
  (i) a first wavelength for writing,
  (ii) a second wavelength for erasing,
  (iii) a third wavelength for reading,
wherein the neural processor is further coupled with an electronic memory device,
wherein the electronic memory device comprises a phase change material of a nanoscaled dimension, or a phase transition material of a nanoscaled dimension,
wherein the nanoscaled dimension is less than 1000 nanometers in any dimension.

2. The system according to claim 1, wherein the optical memory device comprises a phase change material, or a phase transition material.

3. The system according to claim 1, wherein the optical memory device comprises a phase change material of a nanoscaled dimension, or a phase transition material of a nanoscaled dimension, wherein the nanoscaled dimension is less than 1000 nanometers in any dimension.

4. The system according to claim 1, wherein the electronic memory device comprises $Ag_4In_3Sb_{67}Te_{26}$ (AIST) material.

5. A system on chip comprising:
  (a) an electronic memory device; and
  (b) a neural processor,
wherein the neural processor comprises memristors,
wherein the neural processor is coupled with the electronic memory device,
wherein the neural processor is further coupled with an optical memory device by an optical signal to electronic signal converter (OEC) device and an optical waveguide,
wherein the optical memory device is activated by
  (i) a first wavelength for writing,
  (ii) a second wavelength for erasing,
  (iii) a third wavelength for reading.

6. The system according to claim 5, wherein the optical memory device comprises a phase change material, or a phase transition material.

7. The system according to claim 5, wherein the optical memory device comprises a phase change material of a nanoscaled dimension, or a phase transition material of a nanoscaled dimension, wherein the nanoscaled dimension is less than 1000 nanometers in any dimension.

8. The system according to claim 5, wherein the electronic memory device comprises a phase change material of a nanoscaled dimension, or a phase transition material of a nanoscaled dimension, wherein the nanoscaled dimension is less than 1000 nanometers in any dimension.

9. The system according to claim 8, wherein the electronic memory device comprises $Ag_4In_3Sb_{67}Te_{26}$ (AIST) material of a nanoscaled dimension, wherein the nanoscaled dimension is less than 1000 nanometers in any dimension.

10. A system on chip comprising:
a microprocessor, or a graphical processor,
wherein the microprocessor, or the graphical processor is electrically coupled with an electronic memory device,
wherein the electronic memory device comprises a selector device,
wherein the electronic memory device comprises $Ag_4In_3Sb_{67}Te_{26}$ (AIST) material of a nanoscaled dimension, wherein the nanoscaled dimension is less than 1000 nanometers in any dimension,
wherein $Ag_4In_3Sb_{67}Te_{26}$ (AIST) material is arranged in three-dimension (3-D),
wherein the system is coupled with an optical memory device by an optical signal to electronic signal converter (OEC) device, or an optical waveguide,
wherein the optical memory device is activated by
  (i) a first wavelength for writing,
  (ii) a second wavelength for erasing,
  (iii) a third wavelength for reading.

11. The system according to claim 10, wherein the microprocessor comprises carbon nanotube based field effect transistors, or phase transition based field effect transistors, or phase change based field effect transistors, wherein the carbon nanotube is metallurgically coupled with a source metal and a drain metal.

* * * * *

UNITED STATES PATENT AND TRADEMARK OFFICE
CERTIFICATE OF CORRECTION

PATENT NO. : 10,803,941 B2  
APPLICATION NO. : 15/530191  
DATED : October 13, 2020  
INVENTOR(S) : Mazed et al.

Page 1 of 1

It is certified that error appears in the above-identified patent and that said Letters Patent is hereby corrected as shown below:

On the Title Page

ADD:  
(72) Inventor: Rex Wiig, Anaheim, CA (US);  
Angel Martinez, Anaheim, CA (US)

Signed and Sealed this  
Ninth Day of March, 2021

Drew Hirshfeld  
*Performing the Functions and Duties of the*  
*Under Secretary of Commerce for Intellectual Property and*  
*Director of the United States Patent and Trademark Office*